US006479842B1

(12) United States Patent
Kano

(10) Patent No.: US 6,479,842 B1
(45) Date of Patent: *Nov. 12, 2002

(54) FIELD EFFECT TRANSISTOR WITH A QUANTUM-WAVE INTERFERENCE LAYER

(75) Inventor: Hiroyuki Kano, Aichi-ken (JP)

(73) Assignee: Canare Electric Co., Ltd., Aichi-gun (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/425,735

(22) Filed: Oct. 22, 1999

(30) Foreign Application Priority Data

Oct. 23, 1998 (JP) .......................................... 10-302789

(51) Int. Cl.[7] .............................................. H01L 29/15
(52) U.S. Cl. ........................... 257/192; 257/15; 257/17; 257/20
(58) Field of Search ................................. 257/9, 12–15, 257/17, 19–21, 24, 79, 94, 96, 97, 183, 184, 186, 187, 192, 199–201, 431, 435, 461, 613–616

(56) References Cited

U.S. PATENT DOCUMENTS

| 4,914,488 | A | * | 4/1990 | Yamane et al. ................. 357/4 |
| 5,737,350 | A | * | 4/1998 | Motoda et al. ................ 372/45 |
| 5,789,760 | A | * | 8/1998 | Irikawa et al. ................ 257/15 |
| 5,932,890 | A | * | 8/1999 | Irikawa et al. ................ 257/15 |
| 6,175,123 | B1 | * | 1/2001 | Kano ............................. 257/9 |

OTHER PUBLICATIONS

Lee et al., Sidegating effect improvement of GaAs metal—semiconductor field effect transistor by multiquantum barrier structure, Appl. Phys. Lett. 67 (14), Oct. 2, 1995, pp. 2046–2048.*

Takagi et al., "Design of Multi–Quantum Barrier (MQB) and Experimental Verification of MQB Effect," Tokyo Institute of Technology, OQE91–13, 1991, pp. 73–78 (with English translation).*

U.S. patent application Ser. No. 09/057,549, filed Apr. 9, 1998, pending.

U.S. patent application Ser. No. 09/064,222, filed Apr. 22, 1998, pending.

U.S. patent application Ser. No. 09/059,374, filed Apr. 14, 1998, pending.

(List continued on next page.)

Primary Examiner—Eddie Lee
Assistant Examiner—Bradley Wm. Baumeister
(74) Attorney, Agent, or Firm—Oblon, Spivak, McClelland, Maier & Neustadt, P.C.

(57) ABSTRACT

A field effect transistor having a quantum-wave interference layer with plural periods of a pair of a first layer W and a second layer B. The second layer B has wider band gap than the first layer W, and the quantum-wave interference layer is formed in a region adjacent to a channel. Each thickness of the first layer W and the second layer B is determined by multiplying by an odd number one fourth of quantum-wave wavelength of carriers in each of the first layer W and the second layer B, which exist around the lowest energy level of the second layer B. The quantum-wave interference layer functions as a carrier reflecting layer, and enable to prevent leakage current from a source to a region except a drain.

4 Claims, 12 Drawing Sheets

OTHER PUBLICATIONS

U.S. patent application Ser. No. 09/296,743, filed Apr. 23, 1999, pending.
U.S. patent application Ser. No. 09/245,299, filed Feb. 5, 1999, pending.
U.S. patent application Ser. No. 09/300,389, filed Apr. 27, 1999, pending.
U.S. patent application Ser. No. 09/320,510, filed May 26, 1999, pending.
U.S. patent application Ser. No. 09/421,221, filed Oct. 20, 1999, pending.
U.S. patent application Ser. No. 09/422,078, filed Oct. 21, 1999, pending.
U.S. patent application Ser. No. 09/425,737, filed Oct. 22, 1999, pending.
U.S. patent application Ser. No. 09/425,735, filed Oct. 22, 1999, pending.
U.S. patent application Ser. No. 09/425,685, filed Oct. 22, 1999, pending.
U.S. patent application Ser. No. 09/461,331, filed Dec. 15, 1999, pending.
U.S. patent application Ser. No. 09/461,756, filed Dec. 16, 1999, pending.
U.S. patent application Ser. No. 09/425,735, filed Oct. 22, 1999, pending.
U.S. patent application Ser. No. 09/915,384, filed Jul. 27, 2001, pending.
U.S. patent application Ser. No. 09/688,201, filed Oct. 16, 2000, pending.
U.S. patent application Ser. No. 09/695,312, Oct. 25, 2000, pending.
U.S. patent application Ser. No. 09/636,081, filed Aug. 11, 2000, pending.
U.S. patent application Ser. No. 09/645,931, filed Aug. 25, 2000, pending.
U.S. patent application Ser. No. 09/648,367, filed Aug. 25, 2000, pending.
U.S. patent application Ser. No. 09/645,932, filed Aug. 25, 2000, pending.
U.S. patent application Ser. No. 09/669,855, filed Sep. 27, 2000, pending.

* cited by examiner

F I G. 9
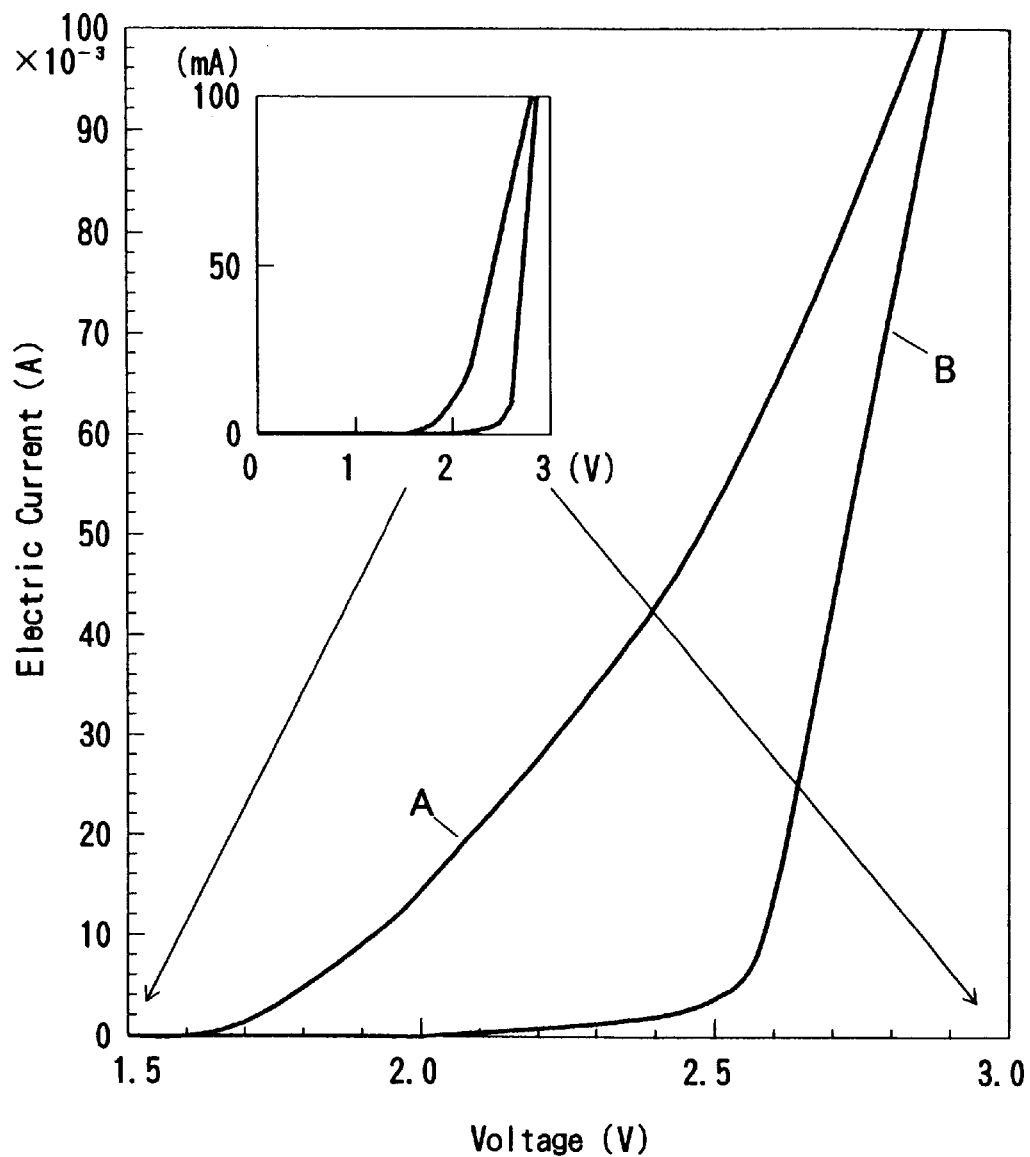

F I G. 1 2
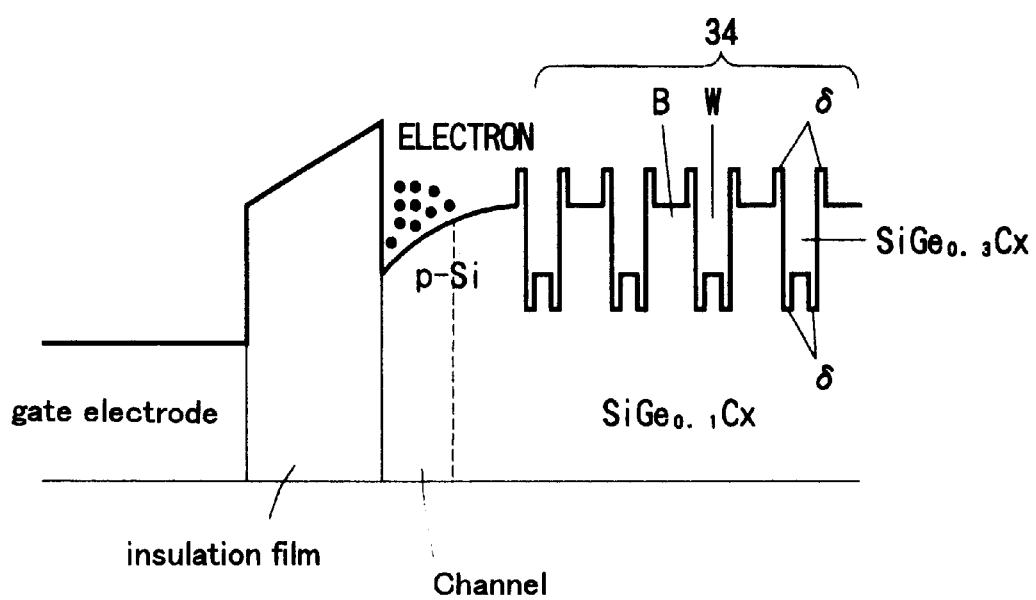

FIELD EFFECT TRANSISTOR WITH A QUANTUM-WAVE INTERFERENCE LAYER

BACKGROUND OF THE INVENTION

1. Field of the invention

The present invention relates to a field effect transistor (FET) having quantum-wave interference layers that reflect carriers, or electrons and holes, effectively. In particular, the invention relates to field effect transistors including a metal semiconductor field effect transistor (MESFET) having a Schottky junction structure, a metal oxide semiconductor field effect transistor (MOSFET), and a high electron mobility transistor (HEMT) in which carriers are effectively confined in a channel region and used effectively by reflecting the carriers to prevent them from leaking to other region.

2. Description of the Related Art

Plural MOSFETs on a large-scale integrated (LSI) circuit have been known little to have a method to avoid leakage current from a source (S) into the drains (D') of other transistor. Because voltage is applied to gate regions sandwiching a channel (C) region, impurities are doped to the lower gate region of a semiconductor which is used to form a MOSFET. As a result, the method to avoid leakage current is considered to be difficult.

As a countermeasure, reflecting carriers by forming cladding layers with a multi-quantum well structure of a first and a second layers as a unit in a laser diode (LD) has been suggested by Takagi et al. (Japanese Journal of Applied Physics. Vol.29, No.11, November 1990, pp.L1977–L1980). Although it can be led that a band gap energy is used as an alternative of a kinetic energy, this reference does not teach or suggest values of kinetic energy of carriers to be considered and the degree of luminous intensity improvement is inadequate.

SUMMARY OF THE INVENTION

The inventor of the present invention conducted a series of experiments and found that the suggested thicknesses of the first and the second layers by Takagi et al. were too small to reflect carriers, and that preferable thicknesses of the first and second layers are 4 to 6 times larger than those suggested by Takagi et al. Further, the present inventors thought that multiple reflection of quantum-waves of carriers might occur by a multi-layer structure with different band width, like multiple reflection of light by a dielectic multi-film structure. And the inventors thought that it would be possible to increase threshold of the external voltage at which a current starts to flow by the quantum-wave reflection. As a result, the inventors invented a preferable quantum-wave interference layer and applications of the same.

It is, therefore, an object of the present invention to provide a field effect transistor having a novel junction structure with considerably larger threshold of voltage at which a current starts to flow by forming a quantum-wave interference layer in a lower gate region adjacent to a channel.

In light of these objects a first aspect of the present invention is a field effect transistor comprising a quantum-wave interference layer having plural periods of a pair of a first layer and a second layer in a region adjacent to a channel, the second layer having a wider band gap than the first layer. Each thickness of the first and the second layers is determined by multiplying by an odd number one fourth of quantum-wave wavelength of carriers in each of the first and the second layers, which exist around the lowest energy level of the second layer.

The second aspect of the present invention is a field effect transistor comprising a quantum-wave interference layer having plural periods of a pair of a first layer and a second layer as a unit in a region adjacent to a channel. The second layer has a wider band gap than the first layer. A δ layer is included for sharply varying energy band and is formed between the first and the second layers. Each thickness of the first and the second layers is determined by multiplying by an odd number one fourth of quantum-wave wavelength of carriers in each of the first and the second layers, and a thickness of the δ layer is substantially thinner than that of the first and the second layers.

The third aspect of the present invention is to define each thickness of the first and the second layers as follows:

$$D_W = n_W \lambda_W/4 = n_W h/4[2m_W(E+V)]^{1/2} \quad (1)$$

and $$D_B = n_B \lambda_B/4 = n_B h/4(2m_B E)^{1/2} \quad (2)$$

In Eqs. 1 and 2, h, $m_W$, $m_B$, E, V, and $n_W$, $n_B$ represent a Plank's constant, effective mass of carriers in the first layer, effective mass of carriers in the second layer, kinetic energy of carriers at the lowest energy level around the second layer, potential energy of the second layer to the first layer, and odd numbers, respectively.

The fourth aspect of the present invention is a field effect transistor having a plurality of partial quantum-wave interference layers $I_k$ with arbitrary periods $T_k$ including a first layer having a thickness of $D_{Wk}$ and a second layer having a thickness of $D_{Bk}$ and arranged in series. The thicknesses of the first and the second layers satisfy the formulas:

$$D_{Wk} = n_{Wk} \lambda_{Wk}/4 = n_{Wk} h/4[2m_{Wk}(E_k+V)]^{1/2} \quad (3)$$

and $$D_{Bk} = n_{Bk} \lambda_{Bk}/4 = n_{Bk} h/4(2m_{Bk} E_k)^{1/2} \quad (4)$$

In Eqs. 3 and 4, $E_k$, $m_{Wk}$, $m_{Bk}$, and $n_{Wk}$ and $n_{Bk}$ represent plural kinetic energy levels of carriers flowing into the second layer, effective mass of minority carriers with kinetic energy $E_k+V$ in the first layer, effective mass of carriers with kinetic energy $E_k$ in the second layer, and arbitrary odd numbers, respectively.

The plurality of the partial quantum-wave interference layers $I_k$ are arranged in series from $I_1$ to $I_j$, where j is a maximum number of k required to form a quantum-wave interference layer as a whole.

The fifth aspect of the present invention is a transistor having a quantum-wave interference layer with a plurality of partial quantum-wave interference layers arranged in series with arbitrary periods. Each of the plurality of partial quantum-wave interference layers is constructed with serial pairs of the first and second layers. The widths of the first and second layers of the serial pairs are represented by ($D_{W1}$, $D_{B1}$), . . . , ($D_{Wk}$, $D_{Bk}$), ($D_{Wj}$, $D_{Bj}$). ($D_{Wk}$, $D_{Bk}$) is a pair of widths of the first and second layers and is defined as Eqs. 3 and 4, respectively.

The sixth aspect of the present invention is to form a δ layer between a first layer and a second layer which sharply varies the energy band and has a thickness substantially thinner than that of the first and the second layers.

The seventh aspect of the present invention is to use the quantum-wave interference layer as a reflecting layer for reflecting carriers.

The eighth aspect of the present invention is to constitute a quantum-wave incident facet in the quantum-wave interference layer by a second layer with enough thickness for preventing conduction of carriers by a tunneling effect.

First and Third Aspects of the Present Invention

The principle of the quantum-wave interference layer of the present invention is explained hereinafter. The quantum-wave interference layer is formed in, i.e., a p-layer, which is formed beneath an inversion layer of a field effect transistor. FIG. 1 shows a conduction band of a quantum-wave interference layer with plural periods of a first layer W and a second layer B as a unit. A band gap of the second layer B is wider than that of a first layer. In a channel, electrons as minority carriers flow from a source to a drain. Electrons which leak to the p-layer formed beneath the channel, conduct from left to right as shown by an arrow in FIG. 1. Among the electrons, those that existing around the bottom of the second layer B are likely to contribute to conduction. The electrons around the bottom of the second layer B has a kinetic energy E. Accordingly, the electrons in the first layer W have a kinetic energy E+V which is accelerated by potential energy V due to the band gap between the first layer W and the second layer B. In other words, electrons that move from the first layer W to the second layer B are decelerated by potential energy V and return to the original kinetic energy E in the second layer B. As explained above, kinetic energy of electrons in the conduction band is modulated by potential energy due to the multi-layer structure of the quantum-wave interference layer.

When thickness of the first layer W and the second layer B are equal to order of a quantum-wave wavelength, electrons tend to have characteristics of a wave. The wave length of the electron quantum-wave is calculated by Eqs. 1 and 2 using kinetic energy of the electron. Further, defining the respective wave number vector in first layer W and second layer B as $K_W$ and $K_B$, reflectivity R of the wave is calculated by:

$$R = (|K_W| - |K_B|)/(|K_W| + |K_B|) \quad (5)$$
$$= [\{m_W(E+V)\}^{1/2} - (m_B E)^{1/2}]/[\{m_W(E+V)\}^{1/2} + (m_B E)^{1/2}]$$
$$= [1 - \{m_B E/m_W(E+V)\}^{1/2}]/[1 + \{m_B E/m_W(E+V)\}^{1/2}]$$

Further, when $m_B = m_W$, the reflectivity R is calculated by:

$$R = [1 - \{E/(E+V)\}^{1/2}]/[1 + \{E/(E+V)\}^{1/2}] \quad (6).$$

When $E/(E+V)=x$, Eq. 6 is transformed into:

$$R = (1-x^{1/2})/(1+x^{1/2}) \quad (7).$$

The characteristic of the reflectivity R with respect to energy ratio x obtained by Eq. 7 is shown in FIG. 2.

When the second layer B and the first layer W have S periods, the reflectivity $R_S$ on the incident facet of a quantum-wave is calculated by:

$$R_S = [(1-x^S)/(1+x^S)]^2 \quad (8).$$

When the formula $x \leq 1/10$ is satisfied, $R \geq 0.52$. Accordingly, the relation between E and V is satisfied with:

$$E \leq V/9 \quad (9)$$

Since the kinetic energy E of conducting electrons in the second layer B exists around the bottom of the conduction band, the relation of Eq. 9 is satisfied and the reflectivity R at the interface between the second layer B and the first layer W becomes 52% or more. Consequently, the multi-quantum well structure having two kinds of layers with different band gaps to each other enables to reflect quantum-wave of the electrons injected into the p-layer effectively.

Further, utilizing the energy ratio x enables thickness ratio $D_B/D_W$ of the second layer B to the first layer W to be obtained by:

$$D_B/D_W = [m_W/(m_B x)]^{1/2} \quad (10).$$

The kinetic energy of electrons flowing in a channel from a source to a drain does not exceed-the-level used to design a thickness of a quantum-wave interference layer in the p-layer formed beneath a channel in a field effect transistor substantially. As a result, electrons are reflected and do not cause leakage current to the p-layer formed beneath a channel.

Thicknesses of the first layer W and the second layer B are determined for selectively reflecting either one of holes and electrons, because of a difference in potential energy between the valence and the conduction bands, and a difference in effective mass of holes and electrons in the first layer W and the second layer B. Namely, the optimum thickness for reflecting electrons is not optimum for reflecting holes. Eqs. 5–10 refer to a structure of the quantum-wave interference layer for reflecting electrons selectively. The thickness for selectively reflecting electrons is designed based on a difference in potential energy of the conduction band and effective mass of electrons.

Further, the thickness for selectively reflecting holes is designed based on a difference in potential energy of the valence band and effective mass of holes, realizing another type of quantum-wave interference layer, formed in a field effect transistor having a channel region as an n-layer, for reflecting only holes flowing in a channel and allowing electrons to pass through.

Here an npn-type transistor is explained. Alternatively, a pnp-type transistor can be applied.

Fourth Aspect of the Present Invention

As shown in FIG. 3, a plurality of partial quantum-wave interference layers $I_k$ may be formed corresponding to each of a plurality of kinetic energy levels $E_k$. Each of the partial quantum-wave interference layers $I_k$ has $T_k$ periods of a pair of a first layer W and a second layer B whose respective thicknesses ($D_{Wk}$, $D_{Bk}$) are determined by Eqs. 3 and 4. The plurality of the partial quantum-wave interference layer $I_k$ is arranged in series with respect to the number k of kinetic energy levels $E_k$. That is, the quantum-wave interference layer is formed by a serial connection of $I_1, I_2, \ldots,$ and $I_j$. As shown in FIG. 3, electrons with each of the kinetic energy levels $E_k$ are reflected by the corresponding partial quantum-wave interference layers $I_k$. Accordingly, electrons belonging to each of the kinetic energy levels from $E_1$ to $E_j$ are reflected effectively. By designing the intervals between the kinetic energies to be short, thicknesses of the first layer W and the second layer B ($D_{Wk}$, $D_{Bk}$) in each of the partial quantum-wave interference layers $I_k$ vary continuously with respect to the value k.

Fifth Aspect of the Present Invention

As shown in FIG. 4, a plurality of partial quantum-wave interference layers may be formed with an arbitrary period. Each of the partial quantum-wave interference layers, $I_1, I_2, \ldots$ is made of serial pairs of the first layer W and the second layer B with widths ($D_{Wk}$, $D_{Bk}$) determined by Eqs. 3 and 4. That is, the partial quantum-wave interference layer, e.g., $I_1$, is constructed with serial layers of width ($D_{W1}$, $D_{B1}$), ($D_{W2}$, $D_{B2}$), ..., ($D_{Wj}$, $D_{Bj}$), as shown. A plurality $I_1, I_2, \ldots$ of layers such as layer $I_1$ are connected in series to form the total quantum-wave interference layer. Accordingly, electrons of the plurality of kinetic energy levels $E_k$ are reflected by each pair of layers in each partial quantum-wave interference layers. By designing the intervals between kinetic energies to be short, thicknesses of the pair of the first layer W and the second layer B ($D_{Wk}$, $D_{Bk}$) in a certain partial quantum-wave interference layer varies continuously with respect to the value k.

Second and Sixth Aspects of the Present Invention

The second and sixth aspects of the present invention are directed forming a δ layer at the interface between. the first layer W and the second layer B. The δ layer has an adequately thinner thickness than both of the first layer W and the second layer B and sharply varies an energy band. Reflectivity R of the interfaces determined by Eq. 7. By forming the δ layer, the potential energy V of an energy band becomes larger and the value x of Eq. 7 becomes smaller. Accordingly, the reflectivity R becomes larger. Also, by sharply varying the band gap of the interfaces, the potential energy V of an energy band becomes larger and the value x of Eq. 7 becomes smaller. Without forming a δ layer, a part of component of the first layer W and the second layer B mixes when the second layer B is laminated on the first layer W, and an energy band gap which varies sharply cannot be obtained. When a δ layer is formed at each interfaces of the first and the second layers, even if a part of component of the first layer W and the second layer B mixes, an energy band gap varies sharply compared with the case without δ layers.

Variations are shown in FIGS. 5A to 5C. The δ layer may be formed on-both ends of the every first layer W as shown in FIGS. 5A to 5C. In FIG. 5A, the δ layers are formed so that an energy level higher than that of the second layer B may be formed. In FIG. 5B, the δ layers are formed so that a band having lower bottom than that of the first layer w may be formed. In FIG. 5C, the δ layers are formed so that the energy level higher than that of the second layer B and the energy level lower than that of the first layer W may be formed. As an alternative to each of the variations shown in FIGS. 5A to 5C, the δ layer can be formed on one end of the every first layer W.

Forming one δ layer realizes large quantum-wave reflectivity at the interface between the first layer W and the second layer B and a plurality of the δ layers realizes a larger reflectivity as a whole.

Seventh Aspect of the Present Invention

The seventh aspect of the present invention is directed to a quantum-wave interference layer that functions as a reflecting layer and selectively confines carriers in the channel in the front of the quantum-wave interference layer.

Eighth Aspect of the Present Invention

The eighth aspect of the present invention, or forming a thick second layer $B_0$ at the side of an incident plane of the quantum-wave interference layer, and effectively prevents conduction by tunneling effects and reflects carriers.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

FIGS. 8 and 9 are views showing diagrams of a first exemplary I–V characteristic of a transistor (Examples 1);

FIG. 12 is a view showing an energy diagram of the MOSFET in Example 3.

DETAILED DESCRIPTION OF THE PREFERRED EMBODIMENTS

The invention will be more fully understood by reference to the following examples.

EXAMPLE 1

Figure 6:
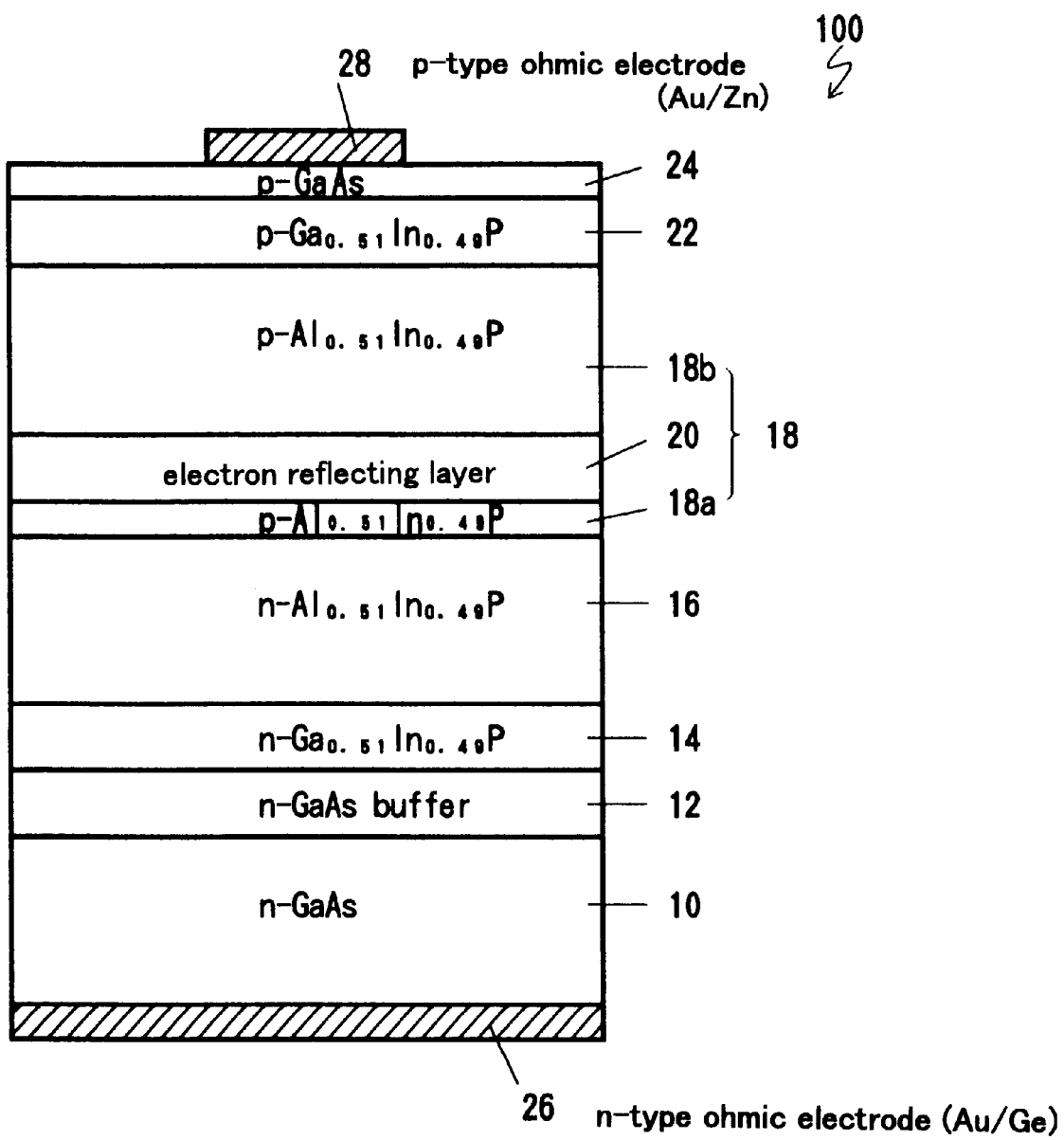
FIG. 6 is a sectional view showing a first exemplary structure of a pn junction device 100 (Example 1)

FIG. 6 is a sectional view of a pn junction device 100 in which a quantum-wave interference layer is formed in a p-layer. The device 100 has a substrate 10 made of gallium arsenide (GaAs). An n-GaAs buffer layer 12 having a thickness generally of 0.3 μm and an electron concentration of $2\times10^{18}/cm^3$ is formed on the substrate 10. An n-$Ga_{0.51}In_{0.49}P$ contact layer 14 of n-type conduction, having a thickness generally of 0.1 μm and electron concentration of $2\times10^{18}/cm^3$, is formed on the buffer layer 12. An n-$Al_{0.51}In_{0.49}P$ cladding layer 16, having a thickness generally of 0.5 μm and an electron concentration of $1\times10^{18}/cm^3$, is formed on the n-contact layer 14. An $Al_{0.51}In_{0.49}P$ p-layer 18, having a thickness generally of 0.6 μm, is formed on the cladding layer 16. An electron reflecting layer 20 functioning as a quantum-wave interference layer is formed in the p-layer 18. A p-layer 18a, having a thickness generally of 0.1 μm and an electron concentration of $1\times10^{17}/cm^3$, and a p-layer 118b, having a thickness generally of 0.5 μm and a hole concentration of $1\times10^{18}/cm^3$, are formed contact to the incident plane and the output plane of the electron reflecting layer 20, respectively. A p-$Ga_{0.51}In_{0.49}P$ second contact layer 22 of p-type conduction, having a thickness generally of 0.1 μm and a hole concentration of $2\times10^{18}/cm^3$, is formed on the p-layer 18b. A p-GaAs first p-type contact layer 24 of p-type conduction, having a thickness generally of 0.1 μm and a hole concentration of $2\times10^{18}/cm^3$, is formed on the second contact layer 22. An electrode layer 26 made of gold and germanium (Au/Ge), having a thickness generally of 0.2 μm, is formed so as to cover the entire back of the substrate 10. Another electrode layer 28 made of gold and zinc (Au/Zn), having a thickness generally of 0.2 μm, is formed on some portion of the first contact layer 24. The substrate 10 has a diameter of 2.0 inches and the normal direction of its main surface is offset toward the [011] axis by 15 degree from the (100) plane.

The pn junction device 100 was manufactured by gas source molecular beam epitaxial deposition (GS-MBE), which is an epitaxial growth method performed under extremely a high vacuum condition. GS-MBE is different from a conventional MBE, which supplies group III and V elements both from the solid sources. In GS-MBE, group III elements such as indium (In), gallium (Ga), and aluminum (Al) are supplied from a solid source and group V elements such as arsenic (As) and phosphorus (P) are supplied by heat decomposition of gas material such as $AsH_3$ and $PH_3$. Alternatively, the LED 100 can be manufactured by metal organic chemical vapor deposition (MOCVD).

Figure 7A:
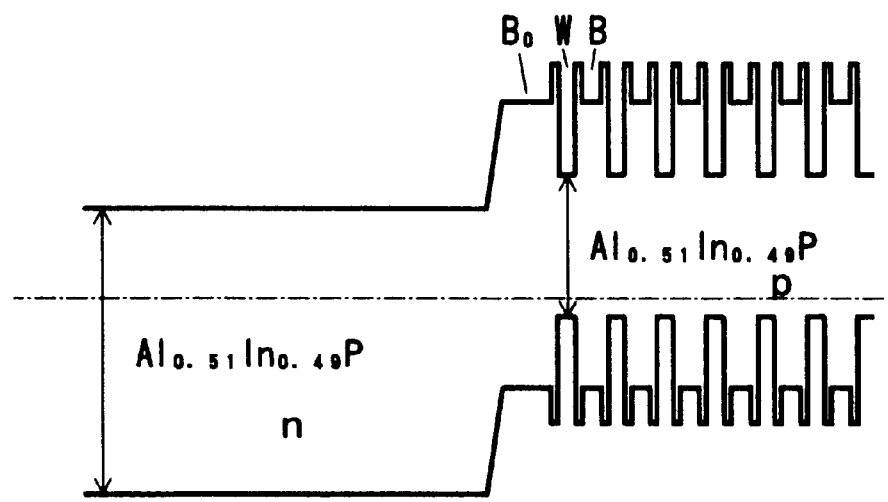
FIGS. 7A–7C are views showing energy diagrams of a pn junction device 100 (Example 1)
Figure 7B:
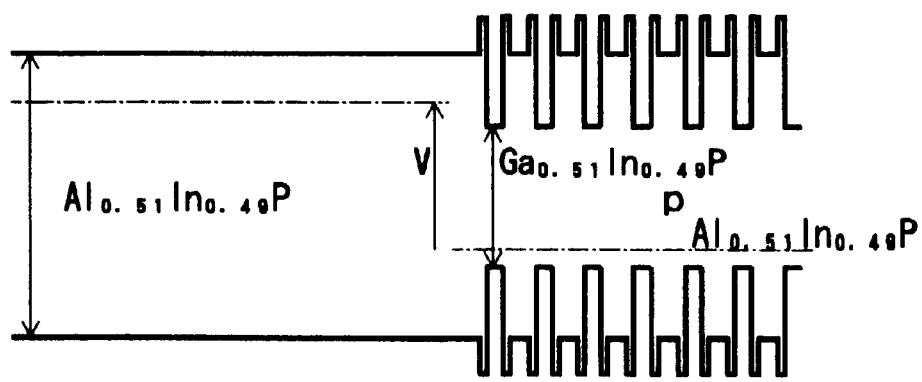
Figure 7C:
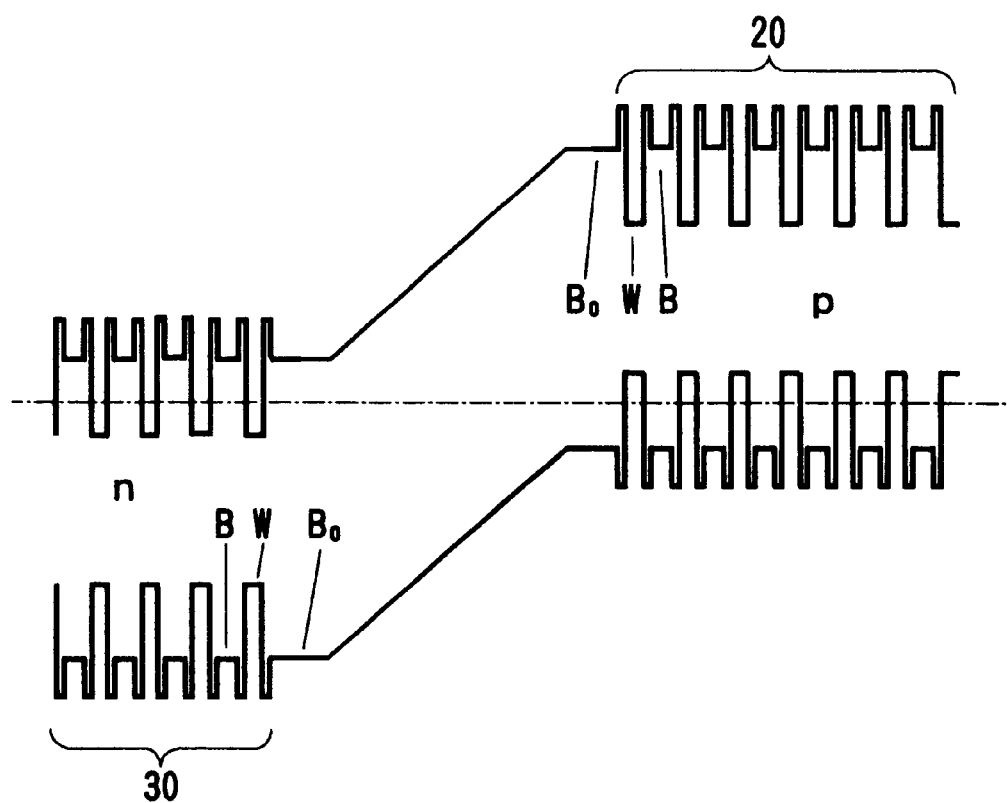

In the energy diagrams of FIGS. 7A, 7B and 7C, the n-layer 16, the p-layer 18a, and the electron reflecting layer 20 are shown. FIG. 7A shows an energy level of conduction and valence bands on the condition that no external voltage is applied to the device 100, and FIG. 7B shows the energy level on the condition that the external voltage is applied thereto. The electron reflecting layer 20, or a quantum-wave interference layer, has a multi-quantum layer structure with 15 periods of a p-$Ga_{0.51}In_{0.49}P$ well layer as a first layer W and a p-$Al_{0.51}In_{0.49}P$ barrier layer as a second layer B. A δ layer made of p-$Al_{0.33}Ga_{0.33}In_{0.33}P$ is formed at each interface between the first layer W and the second layer B. Thicknesses of the first layer W and the second layer B are respectively determined according to Eqs. 1 and 2. Only the first second layer $B_0$ is designed to have enough thickness to prevent conduction of carriers by tunneling effects. The δ layer is formed to have a thickness of 1.3 nm.

Accordingly, when the external voltage is applied to the device 100 in the forward direction, electrons injected from the n-layer 16 into the p-layer 18a are reflected effectively by the electron reflecting layer 20 and are not injected into the p-layer 18b. And when the kinetic energy of electrons injected exceeds the kinetic energy E which designs the electron reflecting layer 20 substantially by increasing applied external voltage, the electron reflecting layer 20 does not reflect electron but let them pass through. Consequently, in I–V characteristic a current is almost 0 until the external voltage exceeds a certain threshold.

Although the valence band of the electron reflecting layer 20 also has a multiple period of-energy level, holes are designed not to be reflected thereby. The respective thickness of the first layer W and the second layer B in the reflecting layer 20 is designed to reflect electrons only. Therefore, holes injected from the p-layer 18b pass through the electron reflecting layer 20 thus reaching the n-layer 16.

I–V characteristic was measured varying the respective thickness of the first layer W and the second layer B of the quantum-wave interference layer. The thickness of the second layer B was fixed at 7 nm and that of the first layer W was varied. A maximum voltage at which I–V characteristic rises abruptly, or threshold, was obtained when the thickness of the first layer W was 5 nm. Then, I–V characteristic was measured fixing the thickness of the first layer W at 5 nm and varying that of the second layer B. When the second layer B has a thickness of 7 nm, threshold showed its maximum. As a result, the pn junction device 100 with the electron reflecting layer 20 was found to have a maximum threshold when the first layer W has a thickness of 5 nm and the second layer B has a thickness of 7 nm.

Figure 8:
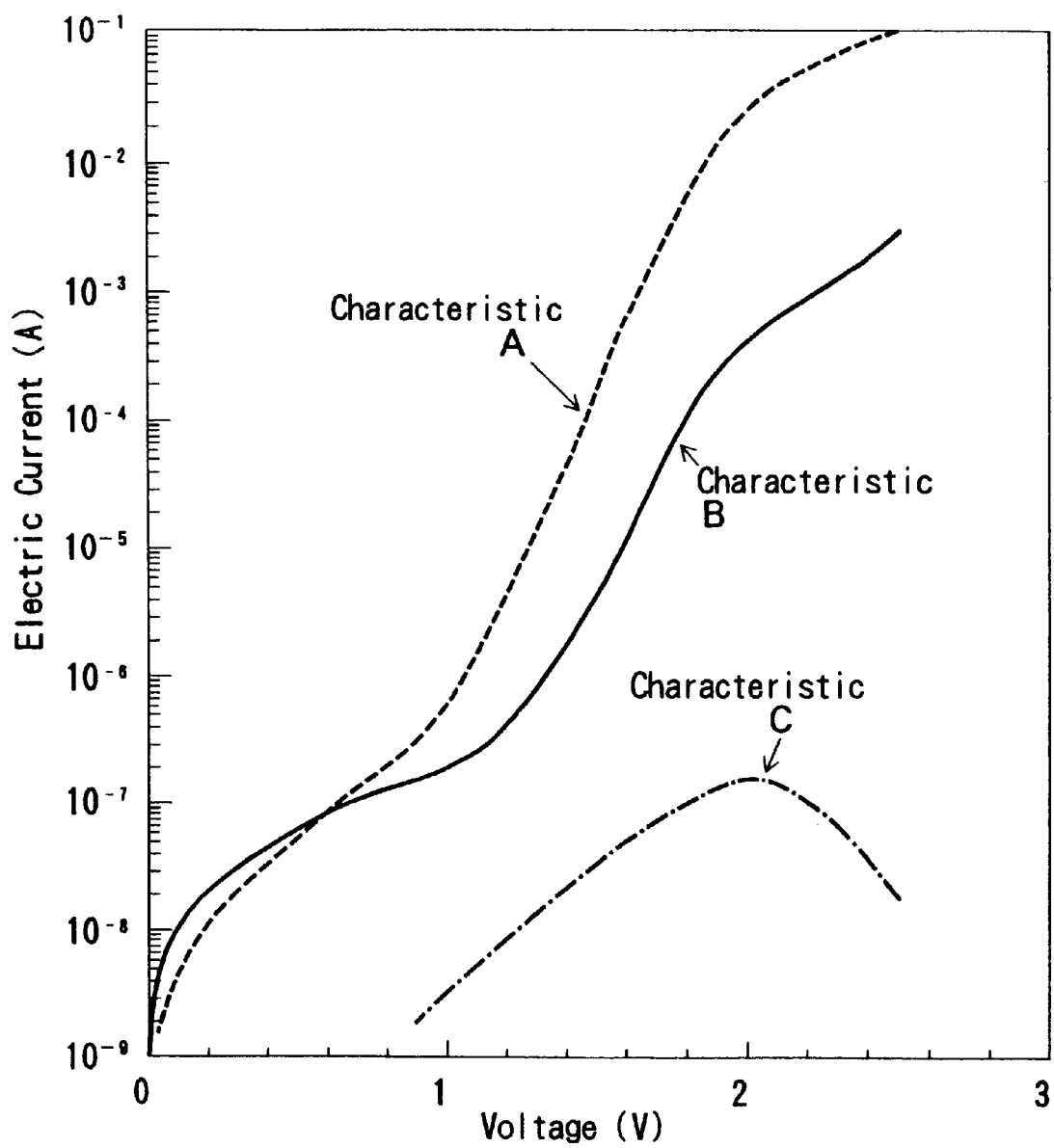

FIGS. 8 and 9 show I–V characteristic B of the device 100. For comparison, a diode without the electron reflecting layer 20, or a pn junction diode of the prior art, was manufactured and its I–V characteristic A was measured. FIG. 8 shows a region of an electric current of I–V characteristic A before it rises rapidly, and also shows that the electric current of the pn junction device 100 is suppressed compared to that of the prior diode without an electron reflecting layer. Characteristic C in FIG. 8 shows a difference of the I–V characteristics A and B in the graph, which display logarithmic figures. When the external voltage is about 2V, C shows its peak, or the suppression of electric current is maximum, or a hundredfold of the minimum electric current. And when the external voltage is 2 V, the energy which injected electrons may have, or a potential energy which is obtained by subtracting quasi-Fermi energy levels in n-layer and p-layer from 2 V, exceeds the bottom of the conduction band of the second layer B and is consider to correspond to kinetic energy E of electrons used to design the thicknesses of the first layer W and the second layer B. FIG. 9 shows I–V characteristic by linear scale. A threshold of the pn junction device 100 increases about 50% compared to that of the prior diode.

This shows that by forming the quantum-wave interference layer in an npn-FET as described above, which reflects electrons, beneath a channel region to be inverted to n-type conduction at conduction, electrons can be prevented from flowing from a source into a beneath region of the channel, i.e., a region except a drain, and as a result, leakage current except the drain can be avoided. In short, a field-effect transistor which has a larger isolation effect compared to a conventional field effect transistor can be obtained.

EXAMPLE 2

Figure 10:
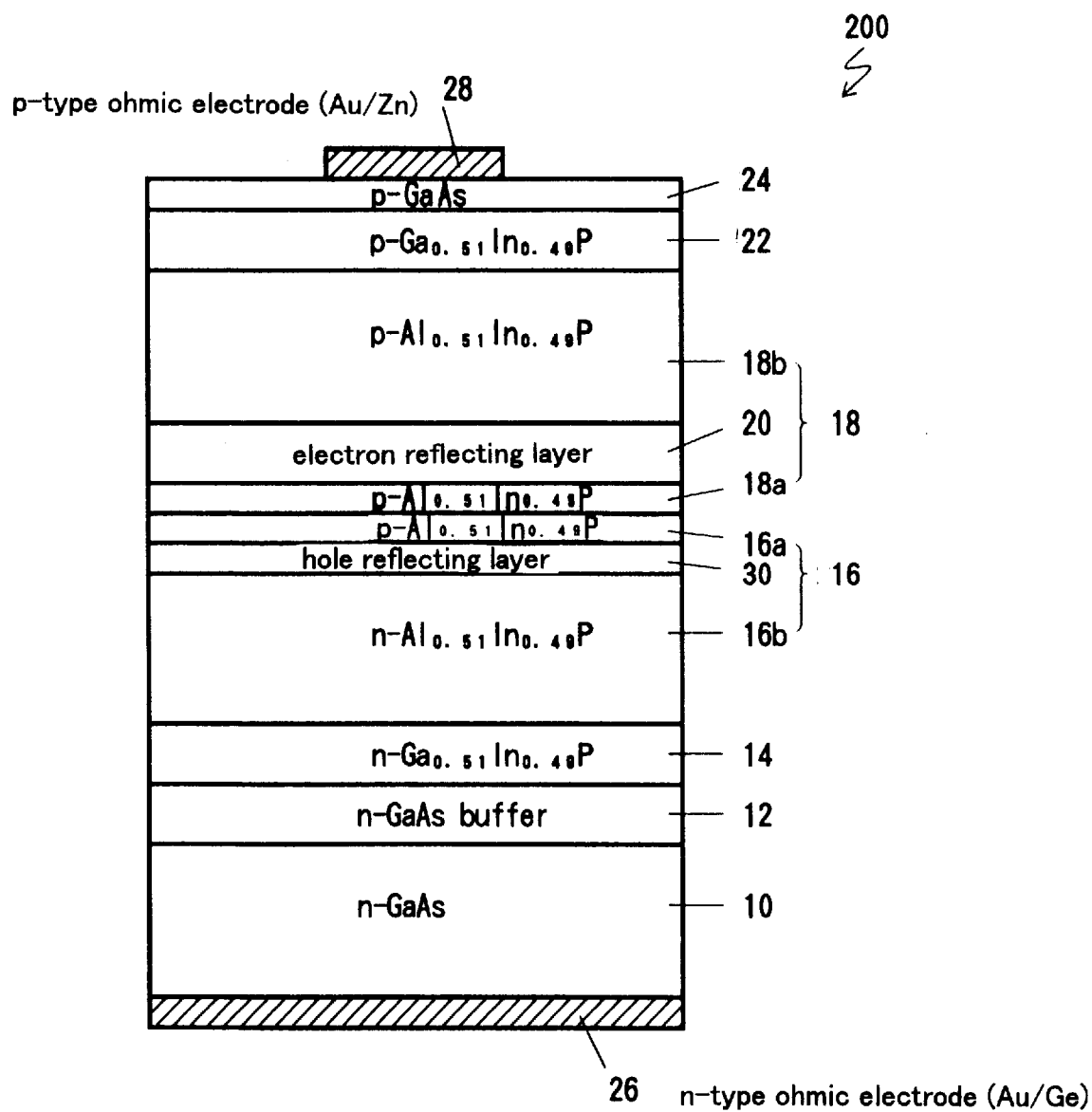
FIG. 10 is a sectional view showing a second exemplary structure of a pn junction device 200 (Example 2)

FIG. 10 shows a pn junction device 200 used in the present embodiment. An electron reflecting layer 20 is formed in a p-layer 18, having the same structure as those of the electron reflecting layer 20 and the p-layer 18 in Example 1. And a hole reflecting layer 30, having the same structure except for width of the first and second layers as that of the electron reflecting layer 20, is formed in an n-layer 16. A p-layer 18a, which is connected to the incident plane of the electron reflecting layer 20 functioning as a quantum-wave interference layer, is designed to have enough thickness to prevent conduction of electrons by a tunneling effects. Also, a n-layer 16a, which is connected to the incident plane of the hole reflecting layer 30 functioning as a quantum-wave interference layer, is designed to have enough thickness to prevent conduction of holes by a tunneling effects. The hole reflecting layer 30 had as same structure as the electron reflecting layer 20 of the pn junction device 200. The thickness of the first layer W and the second layer B of the hole reflecting layer 30 are designed to be 1.0 nm and 1.2 nm respectively to reflect holes effectively. As a result, the pn junction device 200 obtained a larger threshold voltage compared to the pn junction device in Example 1.

This shows that by forming the quantum-wave interference layer in a pnp-FET as described above, which reflects holes, adjacent to a channel region to be inverted to p-type conduction at conduction, holes can be prevented from flowing from a source into a region except a drain, and as a result, leakage current except the drain can be avoided. In short, a field effect transistor which has a larger insolation effect compared to a conventional field effect transistor can be obtained.

EXAMPLE 3

Figure 11:
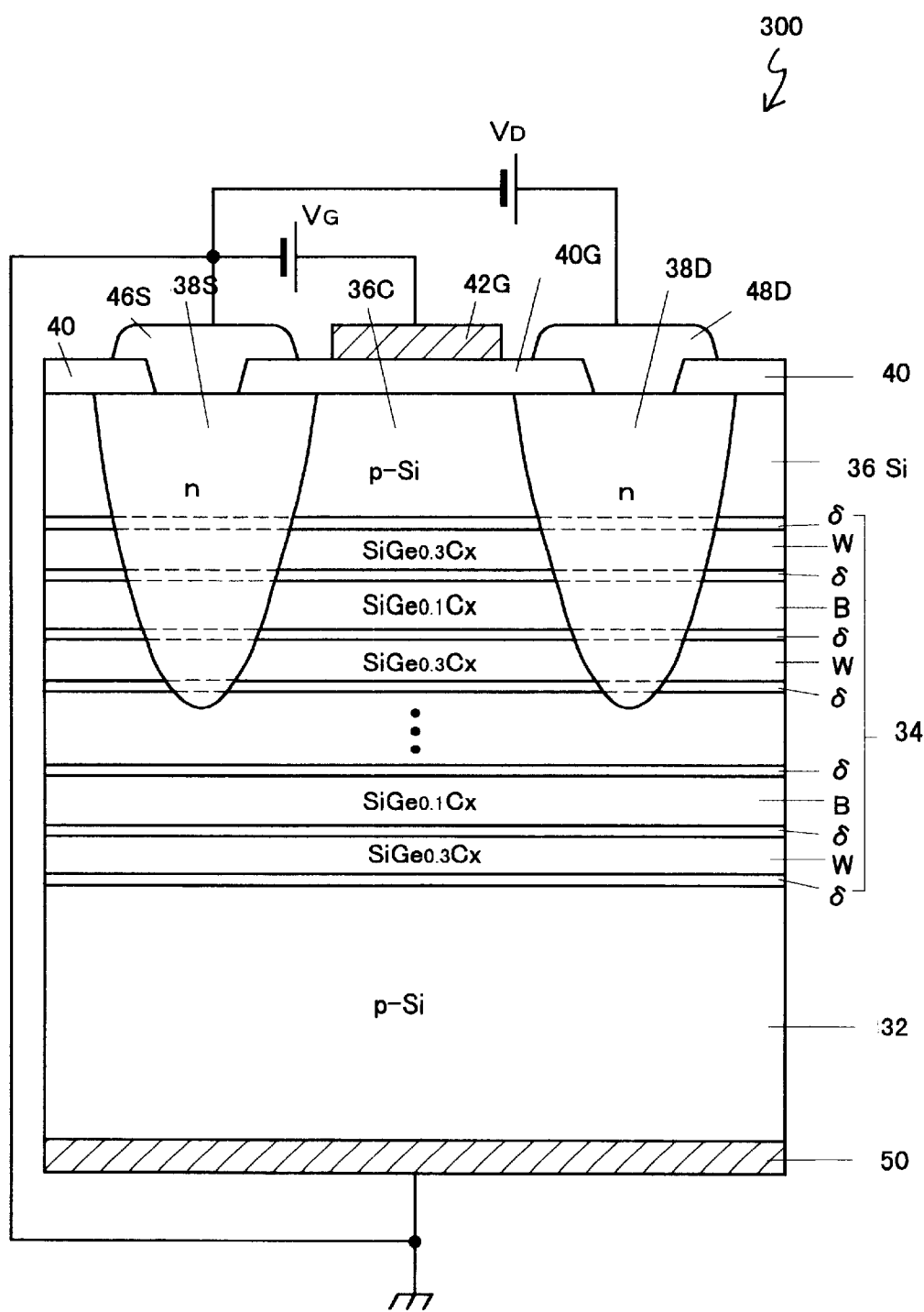
FIG. 11 is a sectional view showing a third exemplary structure of a MOSFET 300 (Example 3)

FIG. 11 shows a MOSFET 300 used in the present embodiment. The MOSFET 300 has a silicon (Si) substrate of p-type conduction. A source region doped to have n-type conduction and a drain region are formed on the substrate, sandwiching a channel region between the source and the drain regions.

The MOSFET 300 has a p-type substrate 32 made of silicon (S). An electron reflecting layer 34, a p-type silicon layer 36 are formed on the substrate 32 in sequence by gas source molecular beam epitaxial deposition (GS-MBE). Then donor impurities are doped from a surface of the p-type silicon layer 36 to form a source region and a drain region. Accordingly, a source region 38S and a drain region 38D doped to show n-type conduction are formed. The source region 38S and the drain region 38D are formed through the p-type silicon layer 36, reaching a part of the electron reflecting layer 34. Then, an insulation layer 40 made of silicon dioxide ($SiO_2$) is formed to cover the upper surface of the p-type silicon layer 36, except some portion of the surface of the source region 38S and the drain region 38D at which electrodes are formed. A part of the insulation layer 40, or a gate insulation layer 40G, is formed on a part of the p-type silicon layer 36, or a channel region 36C, and a metal layer 42G is formed on the gate insulation layer 40G. Electrodes 46S and 48D are formed on the source region 38S and the drain region 38D, respectively. An electrode layer 50 made is formed so as to cover the entire back of the p-type silicon substrate 32. The electrodes 46S and 50 are grounded and potential $V_G$ and $V_D$ are applied to the metal layer 42G and the electrode layer 50, respectively.

The electron reflecting layer 34 has plural periods of a pair of a first layer W and a second layer B. The first layer W is made of silicon germanium carbide ($SiGe_{0.3}C_x$) and have a thickness of 2.0 nm. The second layer B is made of silicon germanium carbide ($SiGe_{0.1}C_x$) and have a thickness of 6.8 nm. A composition ratio x is $0.01 \leq x \leq 0.03$. A δ layer is formed at each interface between the first layer W and the second layer B. Thicknesses of the first layer W and the second layer B are calculated in accordance with the theory of the present invention, using electrons as a carrier.

FIG. 12 is an energy diagram of a MOSFET according to the present embodiment. The MOSFET shown in FIG. 11 has a channel of an inversion layer just beneath the insulation layer 40G, or the channel region 36C, conducting minority carriers (electrons) through the channel. The larger the gate voltage $V_G$ becomes, the more carriers, or electrons, overflow from in the channel of the inversion layer. As a result, signal-to-noise (S/N) ratio decreases. In order to solve the problem, the electron reflecting layer 34, which functions as a quantum-wave interference layer, was formed beneath the channel as shown in FIG. 11 having a multi-layer structure with arbitrary periods including the second layer B made of silicon germanium carbonide ($SiGe_{0.1}C_x$) and the first layer W made of silicon germanium carbonide ($SiGe_{0.3}C_x$). As a result, more carriers were confined in the channel of the inversion layer. Two types of δ layers made of silicon (Si) and germanium (Ge), respectively, are formed so that the energy level higher than that of the second layer B made of $SiGe_{0.1}C_x$ and the energy level lower than that of the first layer W made of $SiGe_{0.3}C_x$ may be formed as shown in FIG. 5C. In FIG. 11, each δ layers made of Si and Ge are simply described as a δ layer. In addition, S/N ratio was improved, response time was shortened, and driving voltage was lowered.

Figure 1:
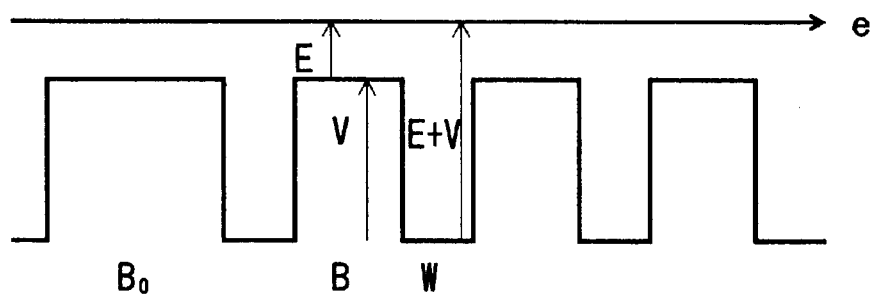
FIG. 1 is an explanatory view of a conduction band of a quantum-wave interference layer according to the first and third aspects of the present invention.
Figure 2:
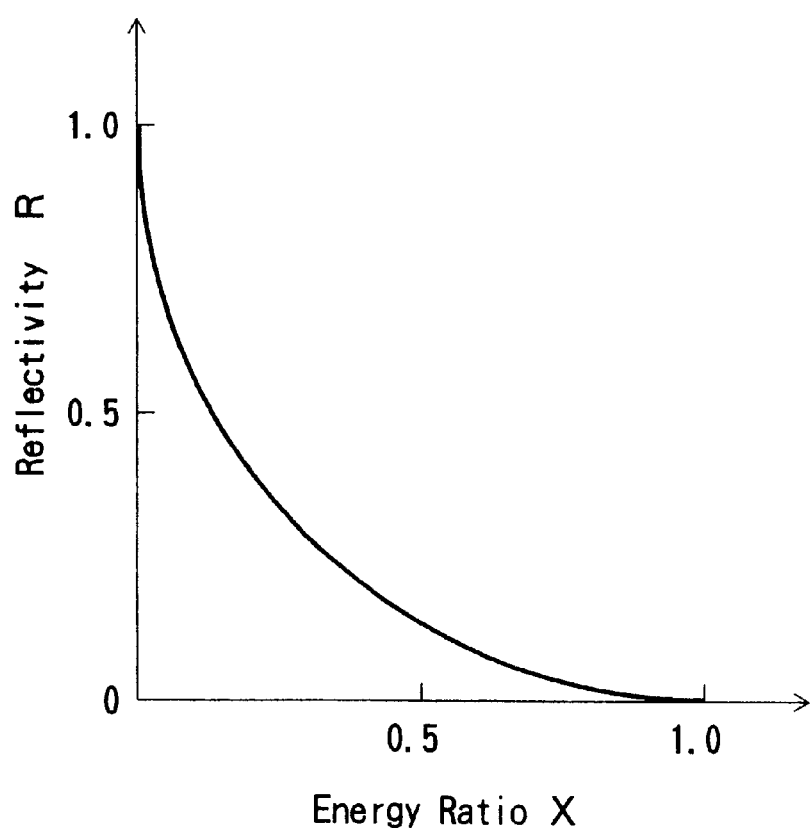
FIGS. 2 is a graph showing a relation between an-energy ratio x and a reflectivity R.
Figure 3:
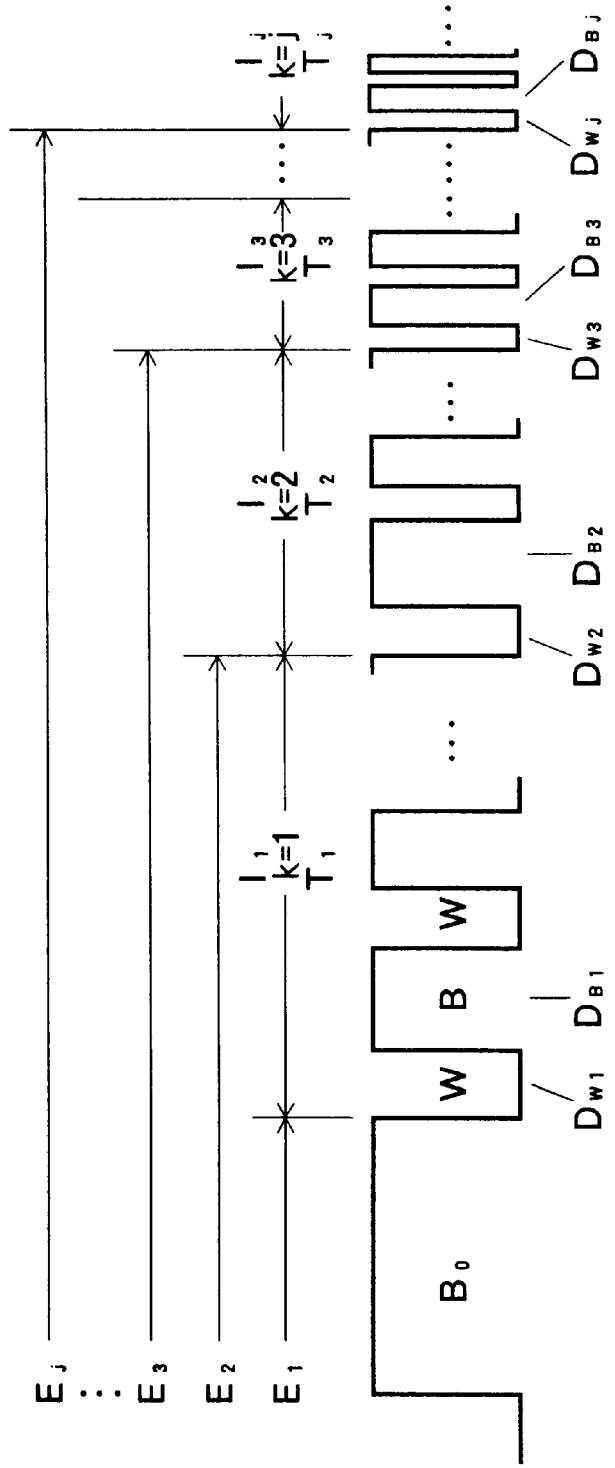
FIG. 3 is an explanatory view of partial quantum-wave interference layers $I_k$ according to the fourth aspect of the present invention.
Figure 4:
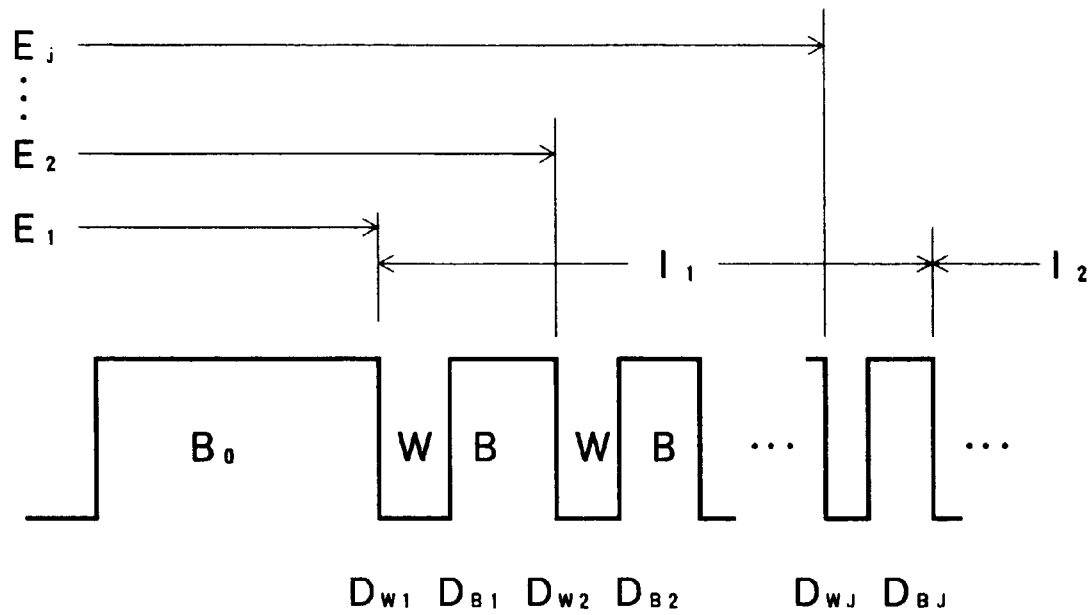
FIG. 4 is an explanatory view of partial quantum-wave interference layers $I_k$ according to the fifth aspect of the present invention.
Figure 5A:
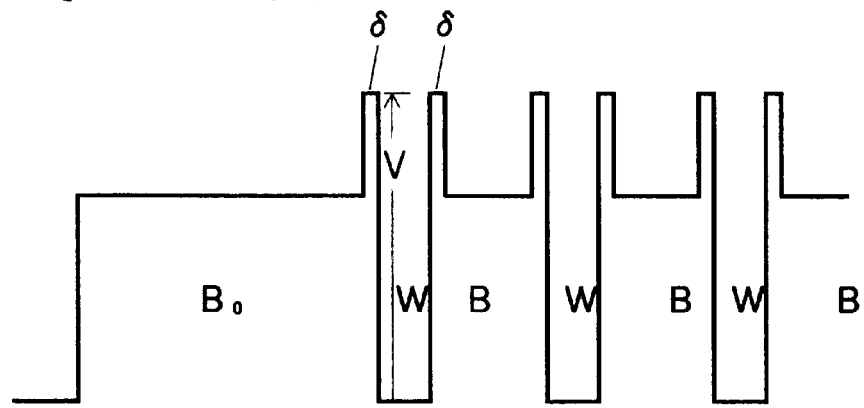
FIGS. 5A–5C are explanatory views of δ layers according to the second and sixth aspects of the present invention.
Figure 5B:
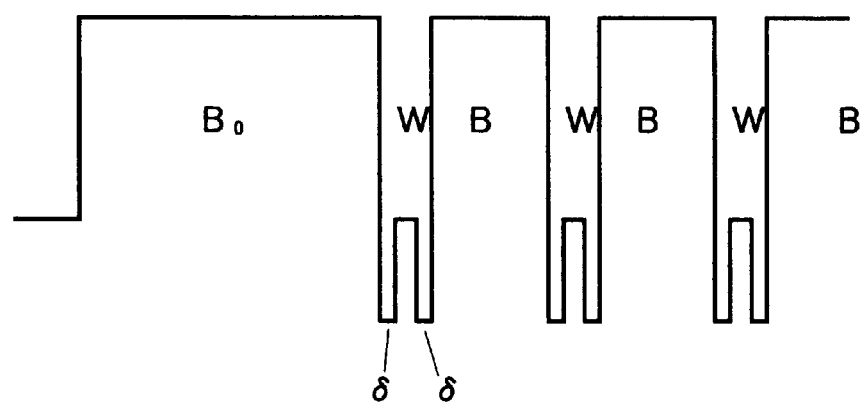
Figure 5C:
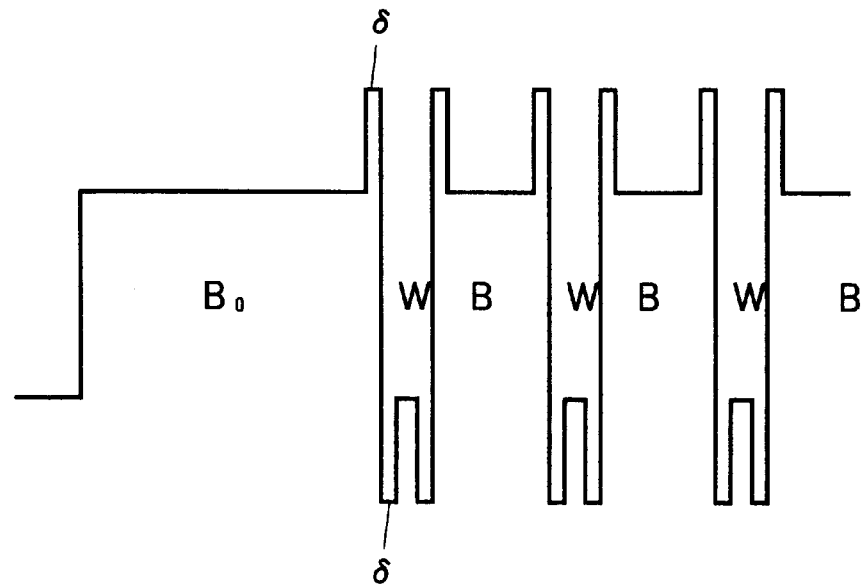

As shown in FIG. 5A, the δ layers can be formed so that an energy level higher than that of the second layer B may be formed. As shown in FIG. 5B, the δ layers can be formed so that a band having lower bottom than that of the first layer W may be formed. The δ layer may be formed on both ends of the every first layer w as shown in FIGS. 5A to 5C. As an alternative to each of the variations-shown in FIGS. 5A to 5C, the δ layer can be formed on one end of the every first layer W. Further alternatively, the δ layers can be formed so that the energy level higher than that of the second layer B and the energy level lower than that of the first layer W may be formed as shown in FIG. 5C.

In the embodiments, a metal oxide semiconductor field effect transistor (MOSFET) having a quantum-wave interference layer is formed. But the present invention is not to be limited to this transistor. Alternatively, a metal semiconductor field effect transistor (MESFET) having a Schottky junction structure, a high electron mobility transistor (HEMT), and other field effect transistor (FET) can have a high insulation effect.

In the embodiment, a quantum-wave interference layer has a high threshold voltage in a semiconductor device to prevent a leakage current. Alternatively, the quantum-wave interference layer can be applied to other semiconductor device except field effect transistor. Especially, the quantum-wave interference layer can improve a insulation between elements of a large-scale integrated (LSI) circuit or other various devices having a similar structure.

Further, in Examples 1–4, the quantum-wave interference layer and the δ layer was made of silicon (Si)/germanium (Ge), ternary compounds including $Ga_{0.51}In_{0.49}P$ and $Al_{0.51}In_{0.49}P$, and quaternary compounds including $Al_{0.33}Ga_{0.33}In_{0.33}P$, respectively. Alternatively, the quantum-wave interference layer having a δ layer between each layers can be made of quaternary compounds such as $Al_xGa_yIn_{1-x-y}P$ or $Al_xGa_yIn_{1-x-y}As$, selecting arbitrary composition ratio within the range of $0 \leq x \leq 1$, $0 \leq y \leq 1$, and $0 \leq x+y \leq 1$.

As another alternative, the quantum-wave interference layer can be made of group III–V compound semiconductor, group II–VI compound semiconductors, Si and Ge, and semiconductors of other hetero-material. The desirable compositions are as follows. Each combinations is represented by a composition of a layer having a wide band width/a layer having a narrow band width//a substrate. And x and y are arbitrary values wherein $0 \leq x \leq 1$ and $0 \leq y \leq 1$, as long as they are not specified.

<1> $Al_xIn_{1-x}P/Ga_yIn_{1-y}P//GaAs$
<2> $Al_xGa_{1-x}As/GaAs//GaAs$
<3> $Ga_xIn_{1-x}P/InP//InP$
<4> $Ga_xIn_{1-x}P/Ga_xIn_{1-x}As//GaAs$
<5> $AlAs/Al_xGa_{1-x}As//GaAs$ ($0.8 \leq x \leq 0.9$)
<6> $InP/Ga_xIn_{1-x}As_yP_{1-y}//GaAs$
<7> $Si/SiGe_x//$arbitrary material ($0.1 \leq x \leq 0.3$)
<8> $Si/SiGe_xC_y//$arbitrary material ($0.1 \leq x \leq 0.3$, $0 \leq y \leq 0.1$)
<9> $Al_{x1}Ga_{y1}In_{1-x1-y1}N/Al_{x2}Ga_{y2}In_{1-x2-y2}N//Si$, SiC, GaN, or sapphire ($0 \leq x_1, x_2, y_1, y_2, x_1+y_1, x_2+y_2 \leq 1$)

While the invention has been described in connection with what are presently considered to be the most practical and preferred embodiments, it is to be understood that the invention is not to be limited to the disclosed embodiments, but on the contrary, the description is intended to cover various modifications and equivalent arrangements included within the spirit and scope of the appended claims. The present document claims the benefit of Japanese priority document, filed in Japan on Oct. 23, 1998, the entire contents of which is incorporated herein by reference.

Obviously, numerous modifications and variations of the present invention are possible in light of the above teachings. It is therefore to be understood that within the scope of the appended claims, the invention may be practiced otherwise than as specifically described herein.

What is claimed is:

1. A field effect transistor comprising:

a quantum-wave interference layer having plural periods of a pair of a first layer and a second layer, said second layer having a wider band gap than said first layer, and said quantum-wave interference layer being formed in a region adjacent to a channel;

wherein each thickness of said first and said second layers is equal to an odd number multiplied by one fourth of a quantum-wave wavelength of carriers in each of said first and said second layers, which exist around the lowest energy level of said second layer, wherein said wavelength $\lambda_W$ in said first layer is equal to $\lambda_W = h/[2m_W(E+V)]^{1/2}$, said wavelength $\lambda_B$ in said second layer is equal to $\lambda_B = h(2m_B E)^{1/2}$, said thickness of said first layer $D_W$ is equal to $D_W = n_W \lambda_W/4$, and said thickness of said second layer $D_B$ is equal to $D_B n_B \lambda_B/4$, wherein h, $m_W$, $m_B$, E, V, and $n_W$ and $n_B$ represent Plank's constant, an effective mass of said carrier in said first layer, an effective mass of said carrier in said second layer, a kinetic energy of carriers at the lowest energy level around said second layer, a potential energy of said second layer to said first layer, and odd numbers, respectively, and wherein $E \leq V/9$.

2. A field effect transistor according to claim 1, wherein a δ layer is formed between said first second layers for sharply varying energy band and has a thickness substantially thinner than said first and said second layers.

3. A field effect transistor according to claim 1, wherein said quantum-wave interference layer functions as a reflecting layer for reflecting said carriers.

4. A field effect transistor according to claim 1, wherein further comprising a non-tunneling layer composed of the same material as said second layer, said non-tunneling layer being at an incident plane of quantum-wave in said quantum-wave interference layer having enough thickness to prevent conduction of carriers by a tunneling effect.

* * * * *